(12) United States Patent
Igarashi et al.

(10) Patent No.: US 7,973,395 B2
(45) Date of Patent: Jul. 5, 2011

(54) SEMICONDUCTOR DEVICE USING LEAD FRAME

(75) Inventors: Hatsuhide Igarashi, Kanagawa (JP); Toshiyuki Yamada, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 228 days.

(21) Appl. No.: 12/453,660

(22) Filed: May 18, 2009

(65) Prior Publication Data
US 2009/0283883 A1    Nov. 19, 2009

(30) Foreign Application Priority Data
May 19, 2008   (JP) .................................. 2008-130687

(51) Int. Cl.
*H01L 23/495*   (2006.01)
(52) U.S. Cl. ................................ 257/676; 257/E23.011
(58) Field of Classification Search .................. 257/670, 257/676, 690, 692, 735, E23.01, E23.011
See application file for complete search history.

(56) References Cited

U.S. PATENT DOCUMENTS 5,623,162 A * 4/1997 Kurihara ...................... 257/666
7,095,372 B2    8/2006 Soler Castany et al.

* cited by examiner

*Primary Examiner* — Quoc D Hoang
(74) *Attorney, Agent, or Firm* — Foley & Lardner LLP

(57) ABSTRACT

A semiconductor device includes: a semiconductor chip configured to process a signal in a radio frequency band; two conductive antenna connection pins connected with two external antenna conductors, respectively; an island for the semiconductor chip to be mounted thereon; a suspending pin connected with the island; and an antenna connection conductor configured to connect the two antenna connection pins without connection with the island and the suspending pin. A series connection of one of the two external antenna conductors, one of the two antenna connection pins, the antenna connection conductor section, the other of the two antenna connection pins and the other of the two external antenna conductors in this order, functions as an antenna by connecting the series connection with the semiconductor chip.

11 Claims, 15 Drawing Sheets

SEMICONDUCTOR DEVICE USING LEAD FRAME

INCORPORATION BY REFERENCE

This patent application claims priority on convention based on Japanese Patent Application No. 2008-130687 filed on May 19, 2008. The disclosure thereof is incorporated herein by reference.

BACKGROUND OF THE INVENTION

1. Field of the Invention

The present invention relates to a semiconductor device package and a method of manufacturing a semiconductor device using a semiconductor device package, and more specifically, to a semiconductor device package for packaging a semiconductor chip that processes a signal in a radio frequency band, and a method of manufacture a semiconductor device using such a semiconductor device package.

2. Description of Related Art

A semiconductor chip with a radio communication function is used for mobile communication equipment and RFID (Radio Frequency Identification). For radio communication with a mobile communication equipment or a reader/writer a radio signal in a 2.45 GHz frequency band is used. An antenna suitable for the used radio frequency band is connected to the semiconductor chip. The semiconductor chip typically has an RF (radio Frequency) input/output circuit connected electrically with the antenna, and a data processing section for processing digital signals. An input/output circuit for digital and analog signals may be contained. Such a semiconductor chip inevitably has a plurality of pad electrodes connected to an output terminal of the RF input/output circuit and an input/output terminal of the input/output circuit.

In order to protect the circuits mounted on the semiconductor chip from the destruction due to ESD (Electrostatic Discharge), an ESD protection circuit is generally built on the semiconductor chip.

FIGS. 1A and 1B are schematic circuit diagrams showing an ESD protection circuit 200. FIG. 1A is an example of a circuit diagram of the ESD protection circuit 200. A signal applied to a pad electrode 201 is supplied to an input buffer 204. The ESD protection circuit 200 is composed of a resistance 202, a diode 203 and a diode 205. A surge voltage applied to the pad electrode 201 due to the ESD is discharged to a power source line and a GND (Ground) line 206 by the diode 203 and the diode 205 via the resistance 202. The surge voltage applied to the pad electrode 201 is decreased due to the resistance 202, and also clamped by the diodes 203 and 205. This prevents the surge voltage of the electrode pad 201 from being applied directly to the input terminal of an input buffer 204 in the ESD protection circuit 200.

FIG. 1B is an equivalent circuit diagram related to the ESD protection circuit 200 of FIG. 1A during an AC operation. PN junctions of the diode 203 and the diode 205 act as a capacitance 213 and a capacitance 215 during the AC operation, respectively. As a result, the ESD protection circuit 200 behaves as a low-pass filter composed of the resistance 202 and the capacitances 213 and 215. As a result, when the pad electrode 201 is connected to the antenna, the property of the AC signal with the radio frequency band supplied from the antenna is considerably deteriorated due to the ESD protection circuit 200.

However, when the ESD protection circuit 200 is not connected to the pad electrode 201, the ESD destruction will occur at the time of handling the semiconductor chip and a semiconductor device, i.e., when the RF input/output circuit to which the ESD protection circuit 200 is not connected is electrically connected to an external terminal of the semiconductor device via a pad electrode. If the surge voltage due to the ESD is applied to the external terminal unprotected against the ESD destruction at the time of mounting such a semiconductor device on the mobile communication equipment, the RF input/output circuit will be destroyed, and thus the mobile communication equipment becomes defective. When being mounted on the mobile communication equipment without applying the surge voltage due to the ESD, the semiconductor chip resists the ESD destruction at the time of the handling thereafter.

U.S. Pat. No. 7,095,372 discloses an integrated circuit package in which an antenna is built. The integrated circuit package includes a semiconductor chip, and a multiple-folded conductor pattern serving as an antenna, both mounted on a board. The semiconductor chip and one end of the antenna are connected by bonding wires, and the other end of the antenna is terminated within the integrated circuit package without connecting to an external terminal of the integrated circuit package. That is, the conductor pattern serving as the antenna does not connect to the external terminal, and thus the semiconductor chip, which is connected to the conductor pattern by the bonding wire, does not connect to the external terminal.

When an antenna is built therein, a size of the semiconductor device becomes larger. It is certainly possible to fold the antenna complicatedly by use of a short coil and a top-loading technique. However, the use of these miniaturization techniques causes the degradation of the properties of the antenna such as narrowing of the frequency band and decrease of a gain. The communication possible distance generally has the highest priority, so that it would have to be said that a loss in an antenna portion is a fatal defect.

SUMMARY

In an aspect of the present invention, a semiconductor device includes: a semiconductor chip configured to process a signal in a radio frequency band; two conductive antenna connection pins connected with two external antenna conductors, respectively; an island for the semiconductor chip to be mounted thereon; a suspending pin connected with the island; and an antenna connection conductor configured to connect the two antenna connection pins without connection with the island and the suspending pin. A series connection of one of the two external antenna conductors, one of the two antenna connection pins, the antenna connection conductor section, the other of the two antenna connection pins and the other of the two external antenna conductors in this order, functions as an antenna by connecting the series connection with the semiconductor chip.

In another aspect of the present invention, a lead frame used for a semiconductor device package, includes: an island on which a semiconductor chip is mounted; a suspending pin connected with the island; leads corresponding to pins of the semiconductor device package; tie bars connected with the leads to support the leads; and a peripheral conductive section connected with the suspending pin and the leads. A bar section is configured to connect ones of the leads while avoiding the island and the suspending pin, after the tie bars are cut away from the peripheral conductive section.

The semiconductor device of the present invention includes merely a matching circuit of an antenna, and a partial wiring of the antenna related to the matching. The antenna itself is provided outside of the semiconductor device, and thus a design can be implemented freely without influence of a size of the semiconductor device. Therefore, the capability of the antenna is not wasted.

In addition, in the semiconductor device of the present invention, the matching circuit as a conductor is connected to the semiconductor chip at two points. Since this corresponds to the short circuit in view of the direct current, the ESD protection circuit is not required. Therefore, impedance does not become lower.

Moreover, the semiconductor device of the present invention fits into the size of a common semiconductor device. For example, when a T-matching circuit is provided in the case of 2.45 GHz used frequently, a length of one side of the semiconductor device package can be 1 cm or less.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF THE PREFERRED EMBODIMENTS

Hereinafter, a semiconductor device package according to the present invention will be described in detail with reference to the attached drawings.

First Embodiment

Figure 1A:
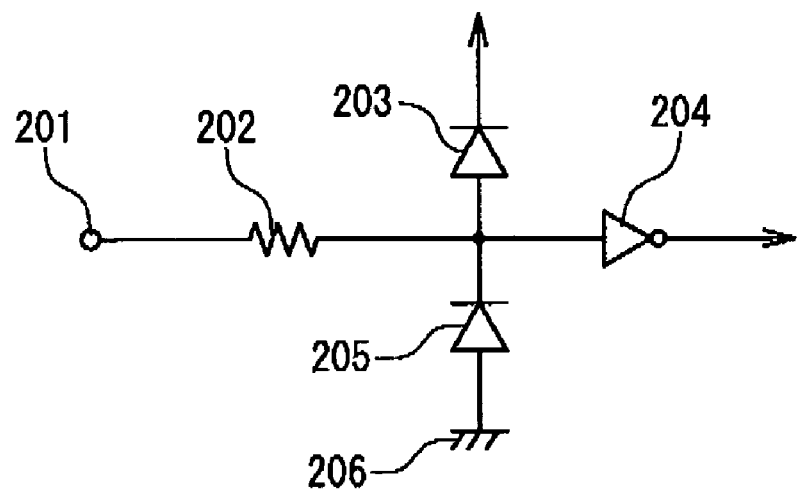
FIG. 1A is an example of a circuit diagram of an ESD protection circuit.
Figure 1B:
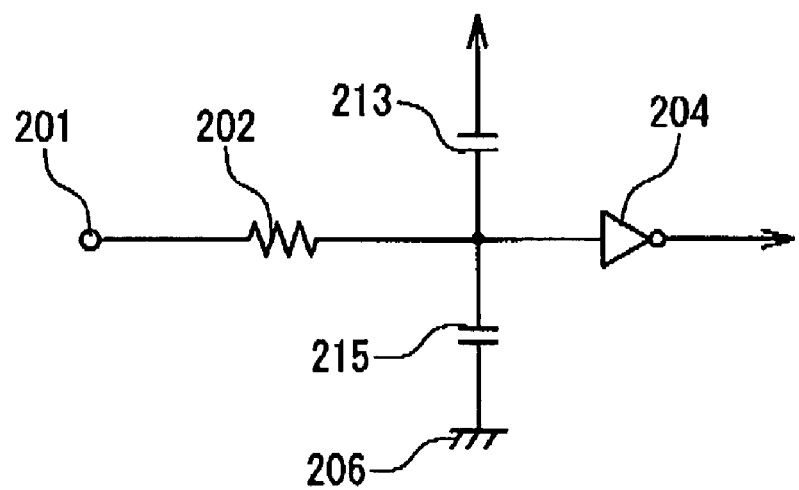
FIG. 1B is an equivalent circuit diagram related to the ESD protection circuit of FIG. 1A during an AC operation.
Figure 2:
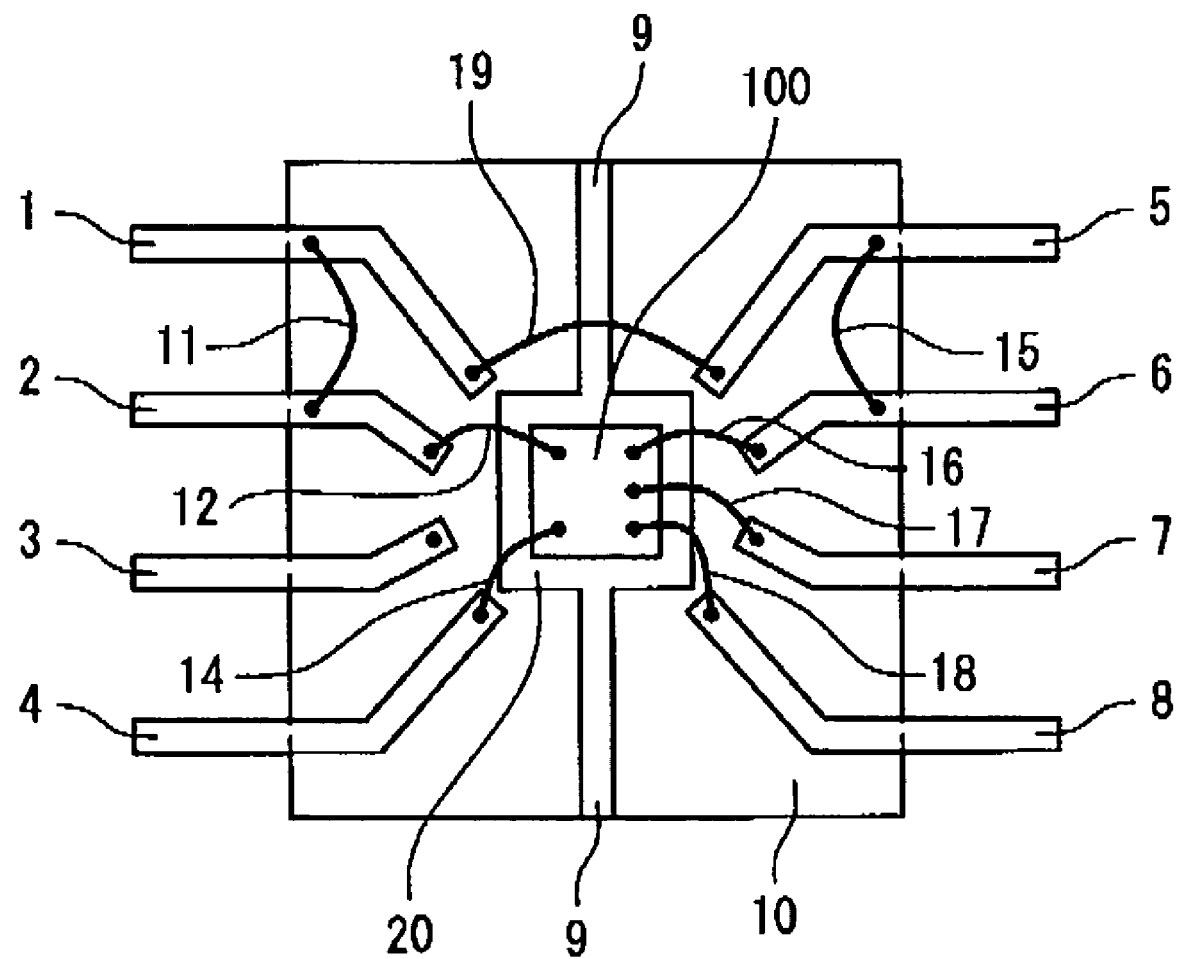
FIG. 2 is a diagram showing an overall arrangement of a semiconductor device package according to a first embodiment of the present invention.

FIG. 2 is a diagram showing the whole of a semiconductor device package according to a first embodiment of the present invention. The semiconductor device package of the present embodiment is provided with a resin mold 10, a plurality of pins 1 to 8, an island 20, and a plurality of bonding wires 11, 12, 14 to 18. Here, the island 20 often has suspending pins 9 connected thereto. In this example, the pins 2 and 6 are connected to two RF input/output sections of the semiconductor chip 100 via the bonding wires 12 and 16, respectively. The pins 4, 7, and 8 are used to input and output various signals to and from the semiconductor chip 100, and power thereto. The pin 3 is not electrically connected to the semiconductor chip 100. The pins 1 and 5 are connected by a bonding wire 19. Here, the bonding wires 19 and suspending pins 9 of the island 20 are three-dimensionally intersects, and are not connected to each other.

A total number of pins and a total number of bonding wires are not limited to this example but are freely designed. The island 20 is used to mount a semiconductor chip 100. The plurality of pins 1 to 8, the island 20, and the suspending pins 9 are formed from a lead frame. The lead frame will now be described.

Figure 3:
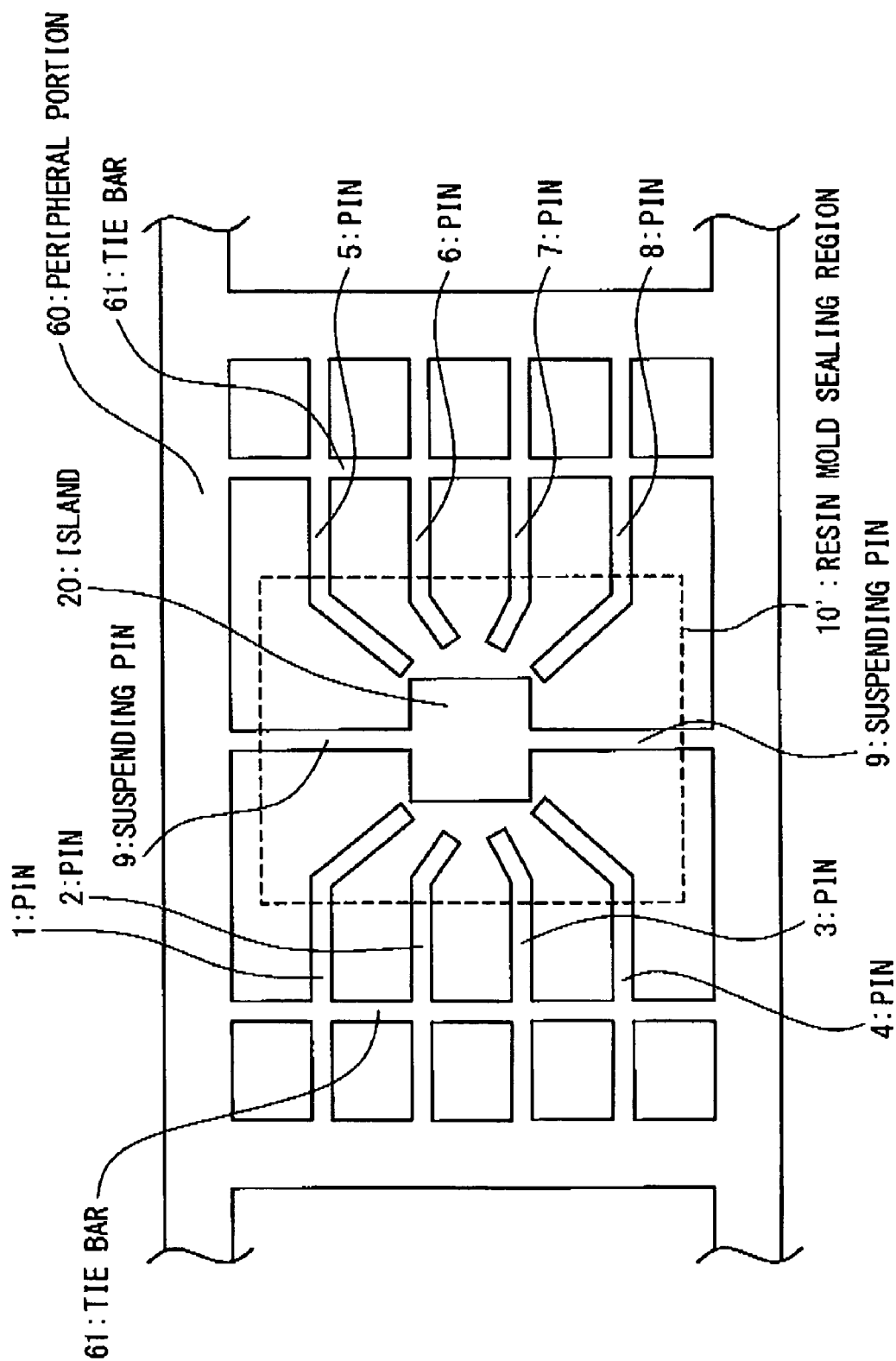
FIG. 3 is a plan view of a lead frame for a single semiconductor device package.

FIG. 3 is a plan view of the lead frame for a single semiconductor device package. The lead frame is formed by stamping out a metal plate in a predetermined shape. The lead frame includes the island 20, the suspending pins 9, the plurality of pins 1 to 8, a plurality of tie bars 61, and a peripheral portion 60. The island 20 is connected to the peripheral portion 60 via the suspending pins 9. The plurality of pins 1 to 8 are connected to the peripheral portion 60 through the tie bars 61.

A resin mold sealing region 10' corresponds to the shape of resin mold 10 in the semiconductor device package. That is, the semiconductor chip 100 is mounted on the island 20, and is subjected to wire bonding by using the bonding wires 11, 12, 14 to 18, and then is subjected to the resin molding in the resin mold sealing region 10'. Further, the tie bars 61 and the peripheral portion 60 are cut off which are redundant portions of the lead frame, and then the pins 1 to 8 remaining outside of the resin mold 10 are bent in a predetermined shape, whereby the semiconductor device is completed. In the lead frame, it is preferable that the portions to which the bonding wires are to be connected are respectively plated in advance. For example, in connecting a gold bonding wire to the lead frame, it is known that previously applying gold plating to a corresponding location on the lead frame improves the quality of the bonding.

Figure 4:
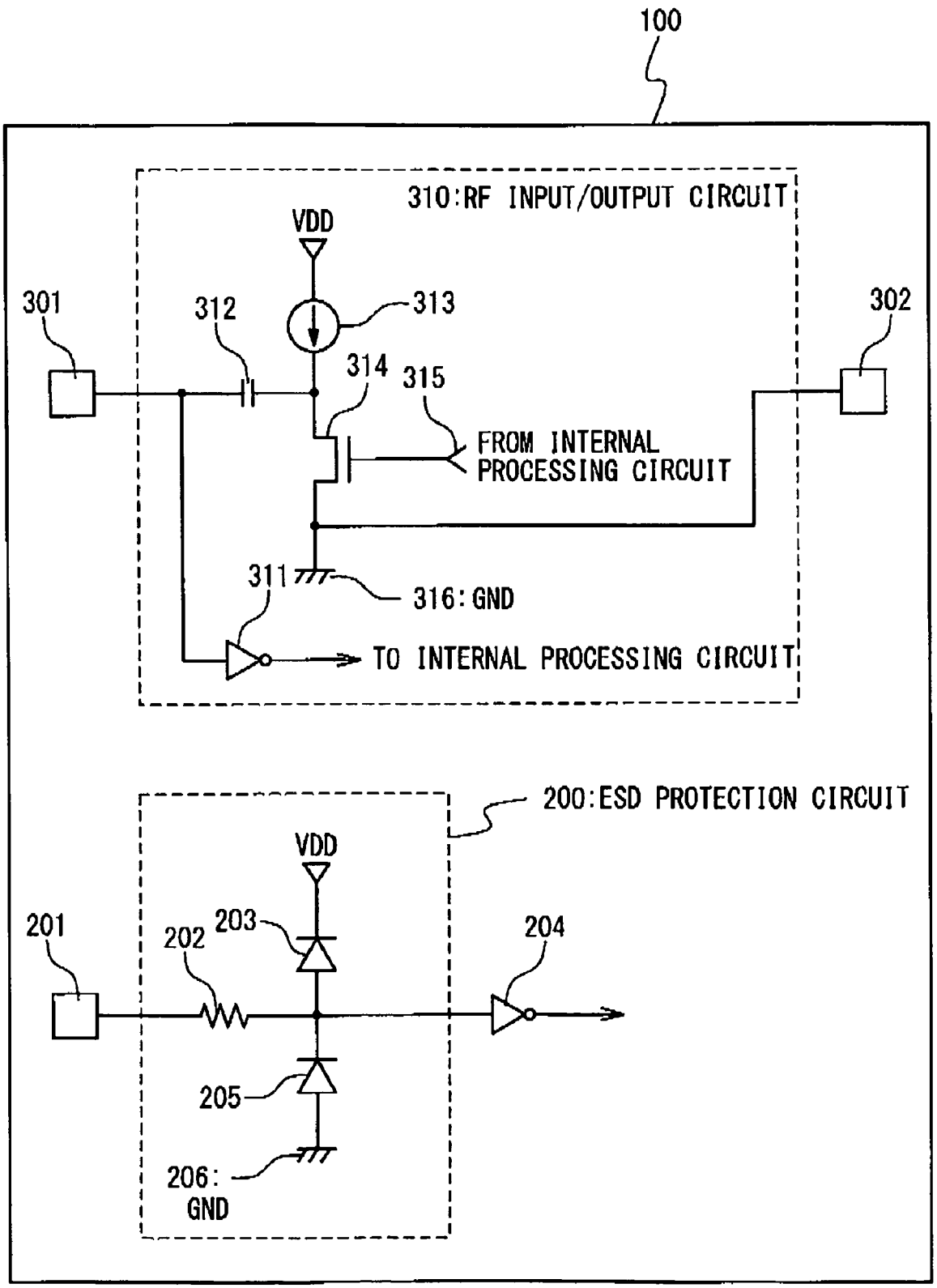
FIG. 4 is an equivalent circuit diagram to a circuit formed on the semiconductor chip shown in FIG. 2.

FIG. 4 is an equivalent circuit diagram to a circuit formed on the semiconductor chip 100 shown in FIG. 2. In an upper portion of FIG. 4, an RF input/output circuit 310 is arranged which is electrically connected to an antenna and communicates data with an external mobile communication equipment by using a signal in a radio frequency range. In a lower portion of FIG. 4, the ESD protection circuit 200 is arranged in order to protect an input buffer circuit that receives a normal digital or an analog signal.

The RF input/output circuit 310 includes an RF output circuit that generates an RF signal to be transmitted, and an RF input circuit that receives an RF signal. The RF output circuit includes a signal input node 315, a constant current source 313 whose one end is connected to a power supply line VDD, a MOSFET (Metal-Oxide Semiconductor Field-Effect Transistor) 314, a GND line 316, a capacitor 312, a first pad electrode 301, and a second pad electrode 302.

In the MOSFET 314, the constant current source 313, the signal input node 315, and the GND line 316 are connected to a drain, a gate, and a source, respectively. A capacitor 312 is also connected to the drain of the MOSFET 314 at one end. The capacitor 312 is further connected to the first pad electrode 301 at the other end. In addition, the second pad electrode 302 is connected to the source of the MOSFET 314. The source and the drain may interchange with each other in accordance with a polarity of the MOSFET 314.

The constant current source 313 supplies constant current to the MOSFET 314. A signal flowing through the MOSFET 314 is amplified based on a signal to be supplied to the signal input node 315 and sent from the drain of the MOSFET 314 to the first electrode 301 via the capacitor 312. In the present example, the capacitor 312 is formed within the semiconductor chip 100, like elements such as the MOSFET 314. Nevertheless, this capacitor 312 may be removed from the semiconductor chip 100 to be connected to the outside of the semiconductor chip 100 as a separate capacitor part. The source of the MOSFET 314 that is connected to the GND wiring 316 is connected to the second pad element 302.

The RF input circuit is provided with an input buffer circuit for an initial amplification operation, whose input terminal is connected to the first pad electrode 301. It should be noted in this case that the ESD protection circuit 200 is not connected to the first pad electrode 301. In general, the ESD protection circuit 200 is connected to the first pad electrode 301, to which the RF input/output circuit is connected, to protect the capacitor 312 and an input buffer from the ESD destruction. However, since the ESD protection circuit 200 serves as a low-pass filter, in the present invention, an ESD protection circuit 200 is not connected to the RF input/output circuit 310 that is a circuit connected to the antenna. In addition, the second pad electrode 302 is also connected to the RF input/output circuit 310, but the connection finally reaches the source of the MOSFET 314 connected to the GND line 316. Therefore, it is unnecessary to connect the ESD protection circuit 200.

In contrast, the ESD protection circuit 200 is connected to an input buffer circuit (in the lower part of FIG. 4) that signals such as a normal digital signal and analog signal in the radio frequency range are handled.

The RF input/output circuit to which the ESD protection circuit is not connected does not suffer the ESD destruction because it has a structure that any voltage is not applied to the pins 2 and 6 to which external antenna conductors 41 and 42 are connected, as described below. That is, the pins 2 and 6 are initially connected to the pad electrode 302 of the semiconductor chip 100 through bonding wires or other pins. The second pad electrode 302 is also connected to the GDN wiring 316 in the semiconductor chip 100, and thus the pins 2 and 6 are grounded in a DC manner. However, this is a kind of resonance circuit, and thus functions as a matching circuit in a specified frequency.

Figure 5:
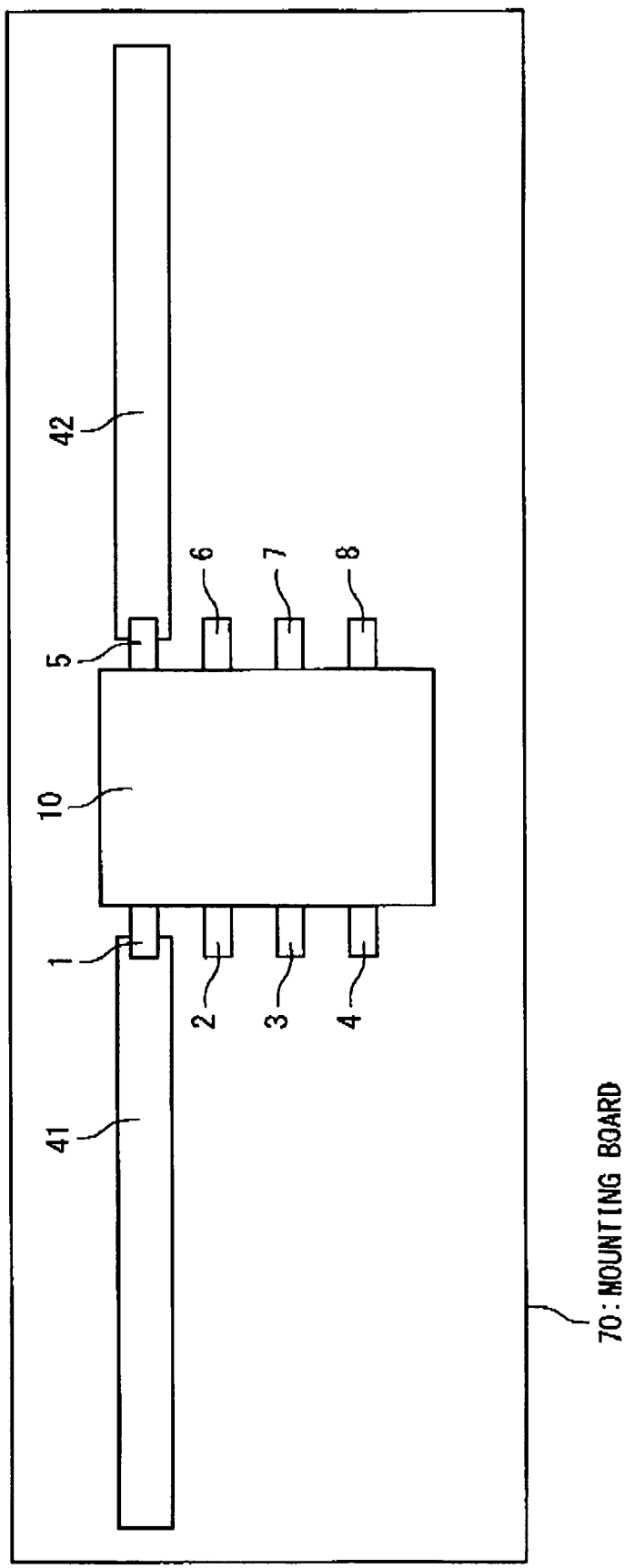
FIG. 5 is a diagram when two external antenna conductors are connected to the semiconductor device using the semiconductor device package according to the present invention.

FIG. 5 is a diagram when two external antenna conductors 41 and 42 are connected to the semiconductor device using the semiconductor device package according to the present invention. The two external antenna conductors 41 and 42 are provided on a mounting board 70 on which the semiconductor device using a semiconductor package according to the present invention is mounted. The pins 1 and 5 are to be connected to the external antenna conductors 41 and 42 after the semiconductor device has completed.

Here, the sequential connection is established in the order of the external antenna conductor 41, the pin 1, the bonding wire 19, the pin 5, and the external antenna conductor 42. They serve as an antenna all together. In this case, the function of a T-matching circuit to the above antenna is realized by the bonding wire 11, a portion from the bonding wire 11 of the pin 2 to the bonding wire 12, the bonding wire 12, a portion from the bonding wire 16 of the pin 6 to the bonding wire 15, and the bonding wire 15. It should be noted that an example that the whole structure serves as a half-wavelength dipole antenna is shown but the present invention is not limited to this example. The structure may serve as a ⅝-wavelength whip antenna or other types of antennas. A tip portion of the pin 2 from the bonding wire 11 and a tip portion of the pin 6 from the bonding wire 15 are not needed. The tip portions of the pins 2 and 6 may be cut off if they are not needed for mounting the completed semiconductor device on a circuit board.

Second Embodiment

Figure 6:
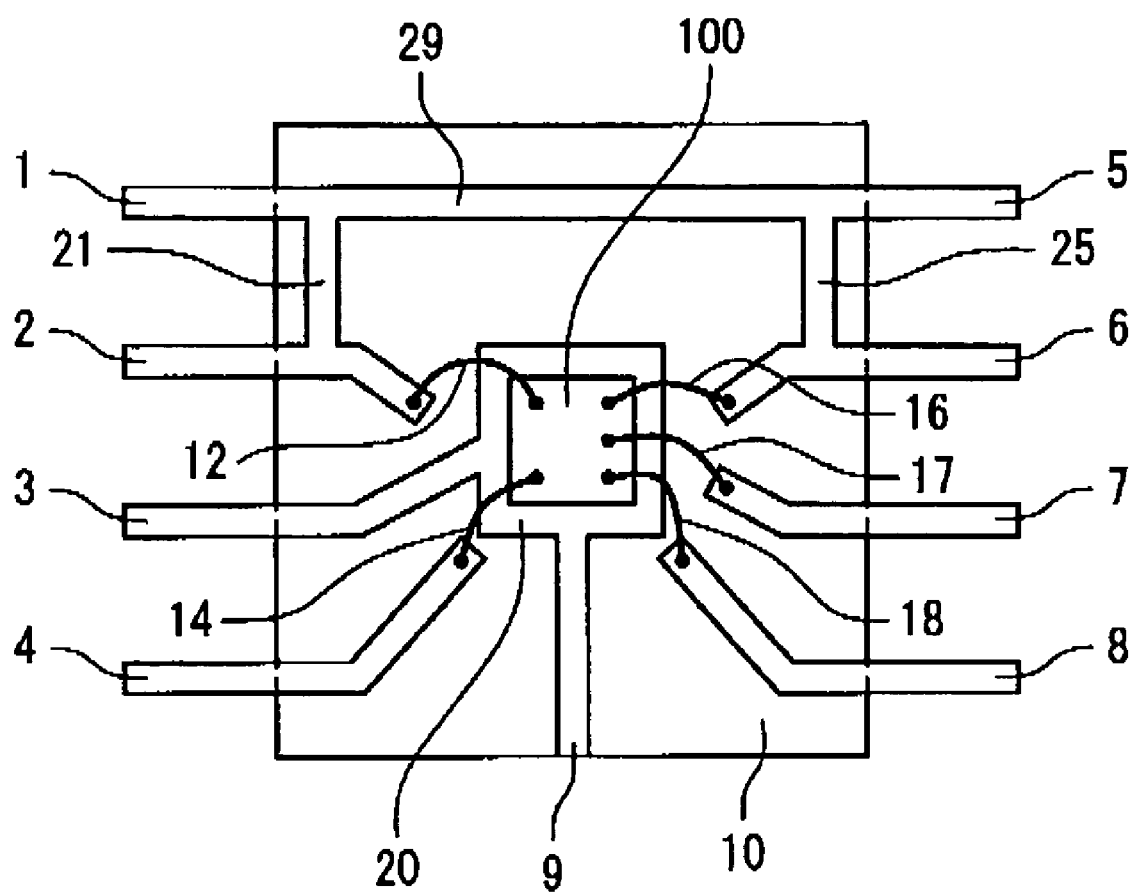
FIG. 6 is a diagram showing the whole of a semiconductor device package according to a second embodiment of the present invention.

FIG. 6 is a diagram showing the whole of a semiconductor device package according to a second embodiment of the present invention. The semiconductor device package of the present embodiment is provided with the resin mold 10, the island 20, the suspending pin 9, the plurality of pins 1 to 8, the connection bars 21, 25, and 29, and the plurality of bonding wires 12, 14, and 16 to 18. A total number of pins and a total number of bonding wires are not limited to this example, and it is possible to freely change them.

The island 20 is for mounting the semiconductor chip 100. The island 20 is supported by the single suspending pin 9 and the pin 3 before it is separated from a lead frame. The pin 1 and the pin 5 are connected by the connection bar 29. The pin 1 and the pin 2 are connected by the connection bar 21, and the pin 5 and the pin 6 are connected by the connection bar 25. The pin 2 and the pin 6 are connected to two RF input/output sections of the semiconductor chip 100, respectively. The pin 1 and the pin 5 are respectively connected to the external antenna conductor 41 and 42 in the same way as the first embodiment. That is, the pins 1, 2, 5 and 6 and the connection bars 21, 25 and 29 serve as a structure that antennas and T-matching circuits are integrated all together.

A tip portion of the pin 2 from the connection bar 21 and a tip portion of the pin 6 from the connection bar 25 are not necessary. The tip portions of the pins 2 and 6 may be cut off if they are not needed for mounting the completed semiconductor device on a circuit board. Since the pins 4, 7 and 8 and the bonding wires 14, 17 and 18 are similar to those described in the first embodiment, a detailed description thereof is omitted.

Figure 7:
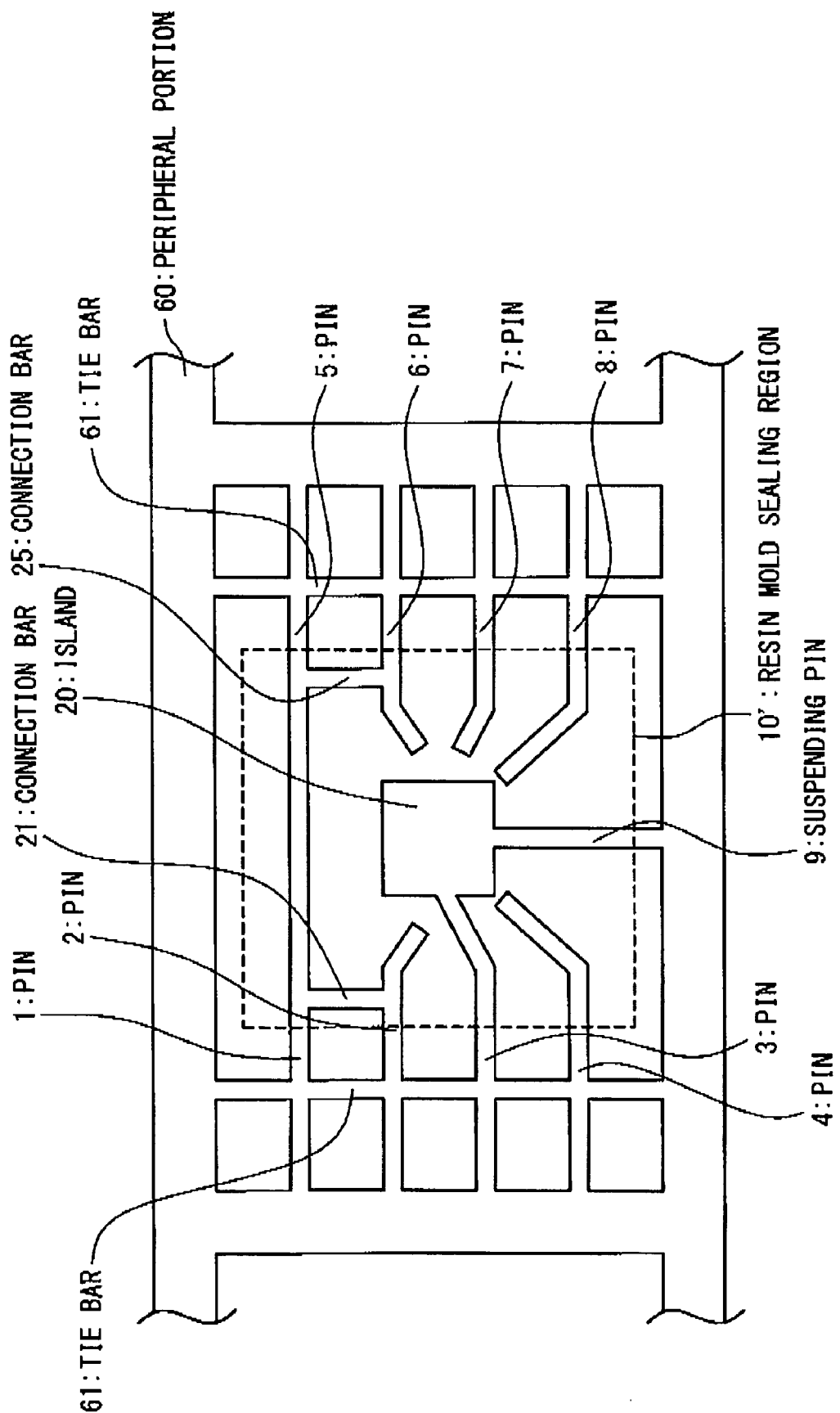
FIG. 7 is a plan view of a lead frame used for forming the semiconductor device package according to the present embodiment.

FIG. 7 is a plan view of a lead frame used for forming the semiconductor device package according to the present embodiment. This is equal to the lead frame in FIG. 3 of the first embodiment with additional two connection bars 21 and 25. Since the other components are same as the first embodiment, a detailed description thereof is omitted.

The connection bar 21 is intended to connect the two pins 1 and 2 to establish conduction even after all tie bars 61 and the peripheral portion 60 are cut off to form a semiconductor device package. Likewise, the connection bar 25 is intended to connect two pins 5 and 6 to establish conduction. In addition, positions of the connection bars 21 and 25 can be freely changed within the resin mold sealing region 10'.

Third Embodiment

Figure 8:
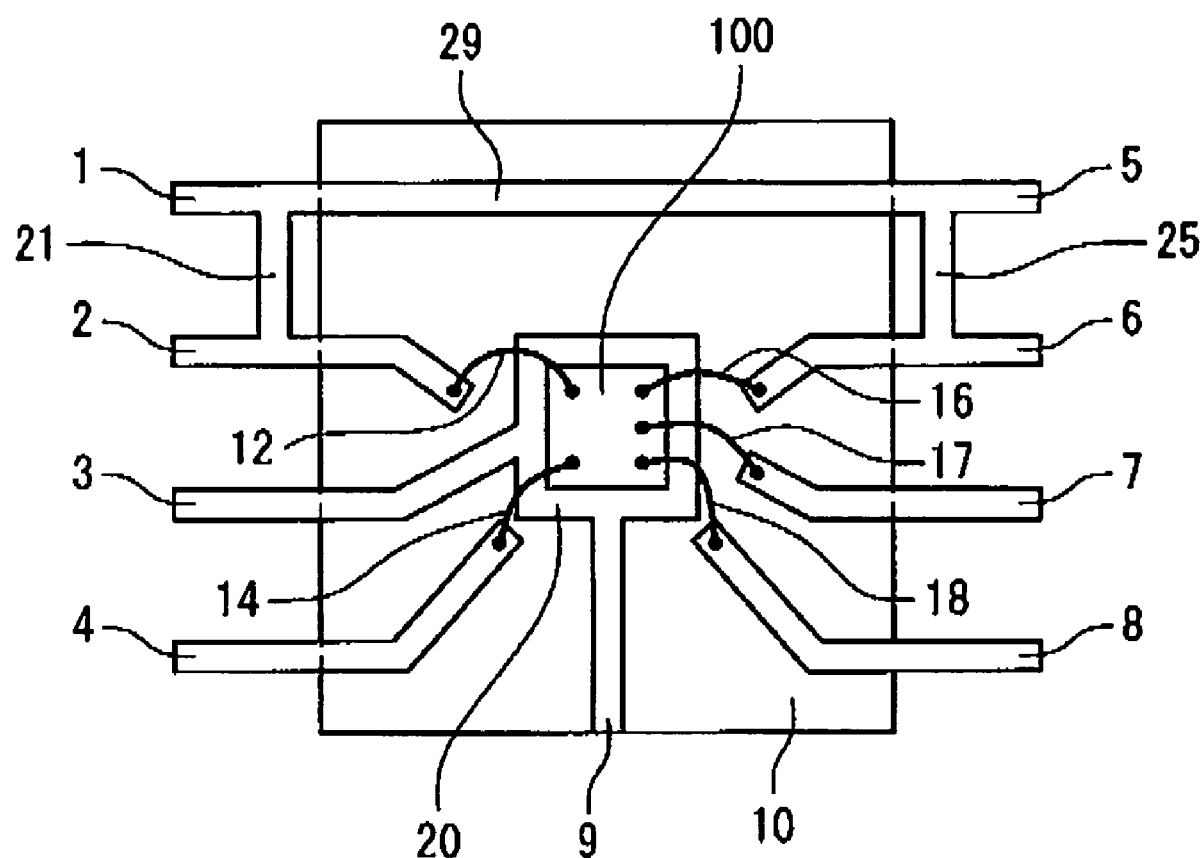
FIG. 8 is a diagram showing the whole of the semiconductor device package according to a third embodiment of the present invention.

FIG. 8 is a diagram showing the whole of the semiconductor device package according to a third embodiment of the present invention. The present embodiment is almost same as the second embodiment, and the difference is in the positions of the connection bars 21 and 25. Since the other portions are same as the second embodiment, a detailed description thereof is omitted.

The pin 1 and the pin 2 are connected by the connection bar 21. Similarly, the pin 5 and the pin 6 are connected by the connection bar 21. These connection bars 21 and 25 are positioned outside of the resin mold 10. The positioning of the connection bars 21 and 25 outside of the resin mold 10 can provide a length of the T-matching circuit longer than a width of the resin mold 10. Therefore, it is possible to cope with a longer wavelength, i.e., a lower frequency.

Figure 9:
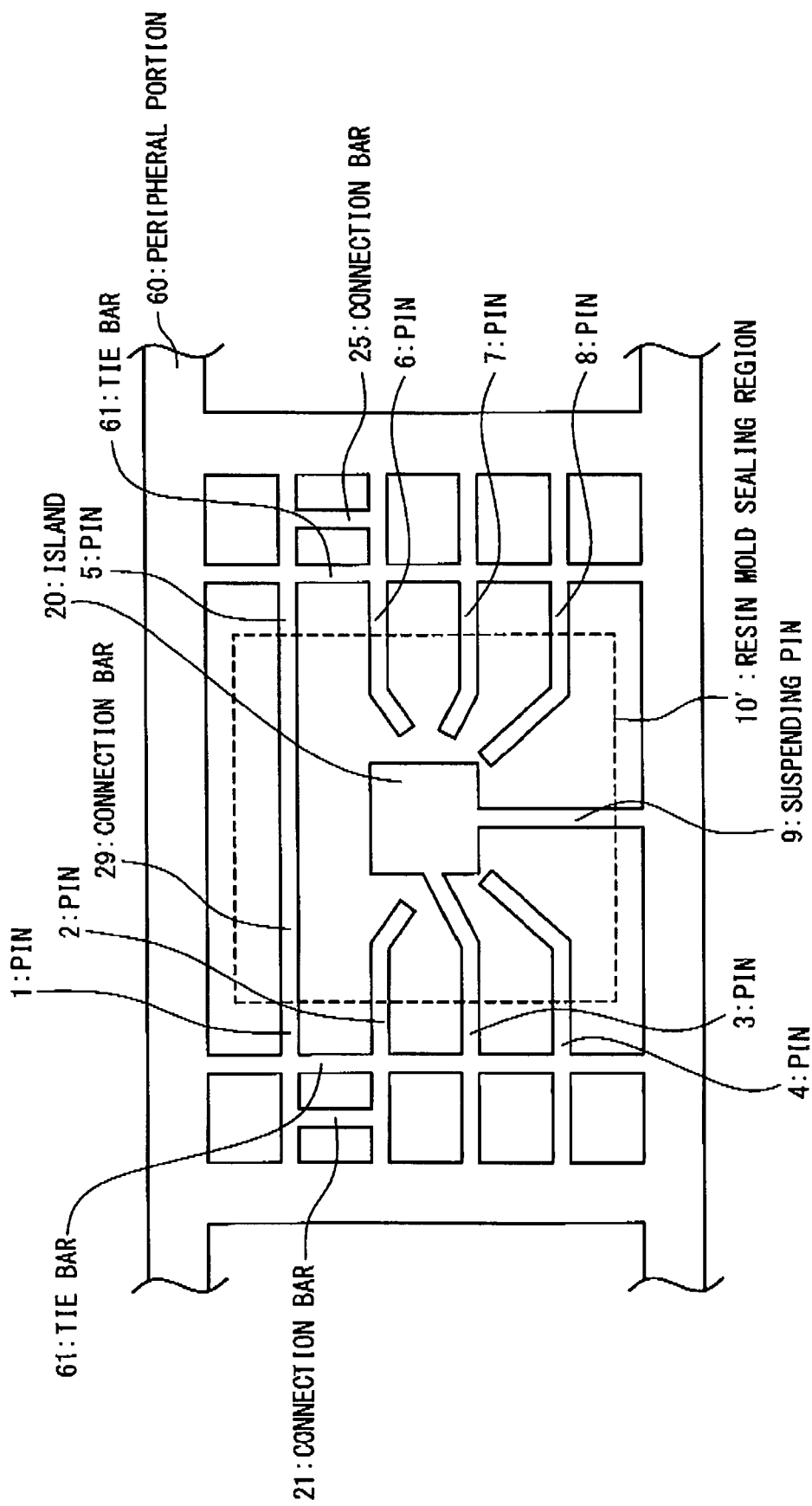
FIG. 9 is a plan view of a lead frame used for forming the semiconductor device package according to the present embodiment.

FIG. 9 is a plan view of a lead frame used for forming the semiconductor device package according to the present embodiment. This is equal to the lead frame in FIG. 3 of the first embodiment with the additional two connection bars 21 and 25. Since the other portions are same as the first embodiment, a detailed description thereof is omitted.

The connection bar 21 is intended to connect two pins 1 and 2 to establish the conduction even after all tie bars 61 and the peripheral portion 60 are cut off to form the semiconductor device package. Likewise, the connection bar 25 is intended to connect two pins 5 and 6 to establish the conduction. In addition, the positions of the connection bars 21 and 25 can be freely changed outside of the resin mold sealing region 10'. It is also an effective technique to prepare the lead frame in the first embodiment and remain a part of the tie bars 61 uncut to form the connection bars 21 and 25.

Figure 10:
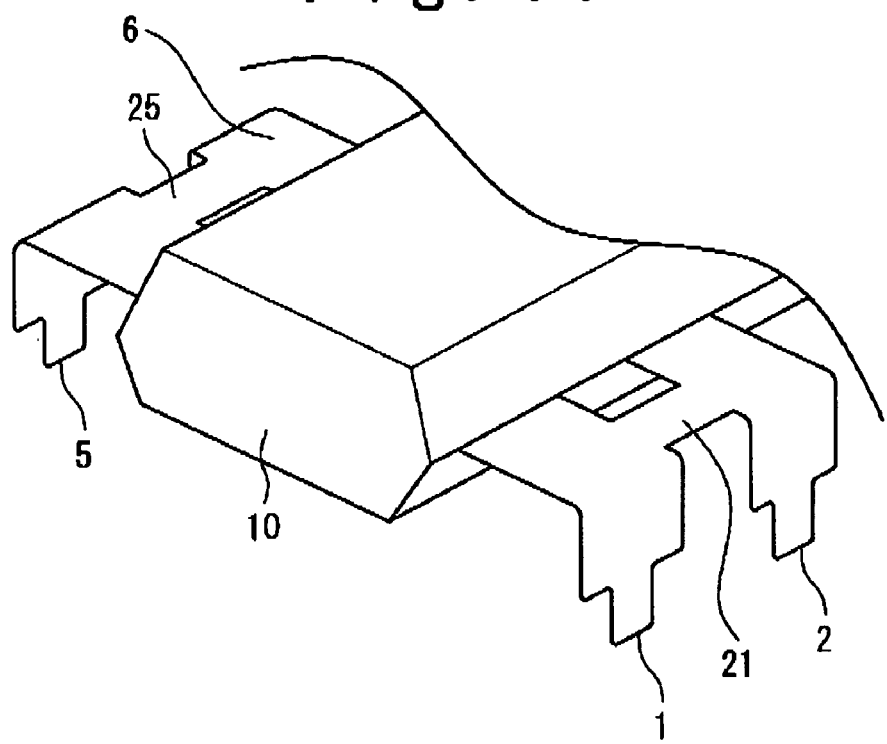
FIG. 10 is a bird's eye view for showing a position of a connection bar at the time of completing the semiconductor device in the third embodiment of the present invention.
Figure 11:
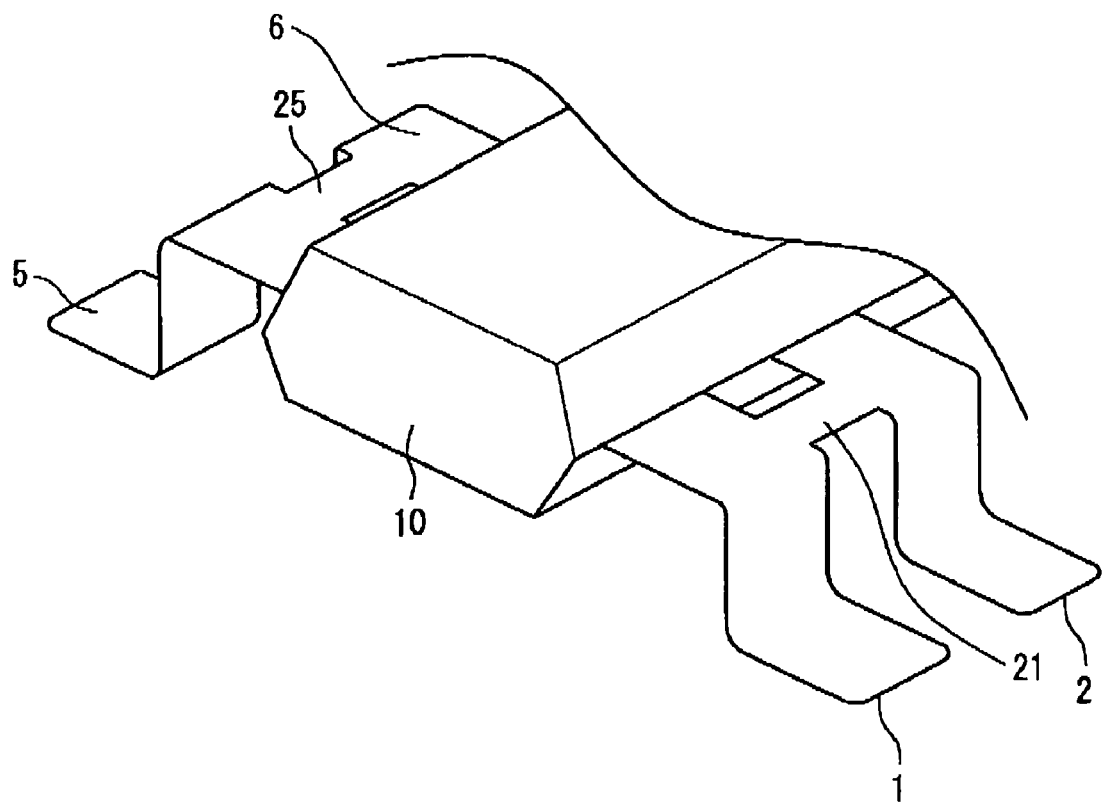
FIG. 11 is a bird's eye view for showing the position of the connection bar at the time of completing the semiconductor device in the third embodiment of the present invention.
Figure 12:
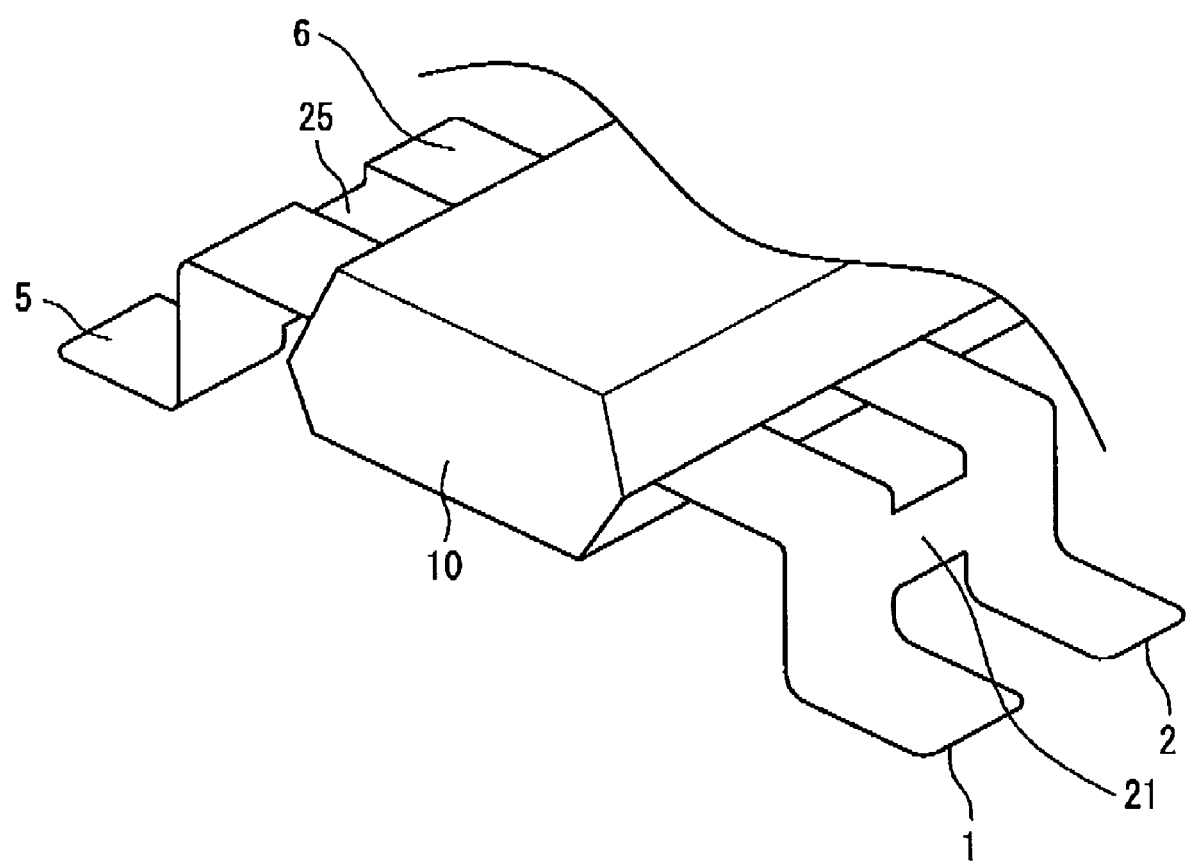
FIG. 12 is a bird's eye view for explaining the position of the connection bar at the time of completing the semiconductor device in the third embodiment of the present invention.
Figure 13:
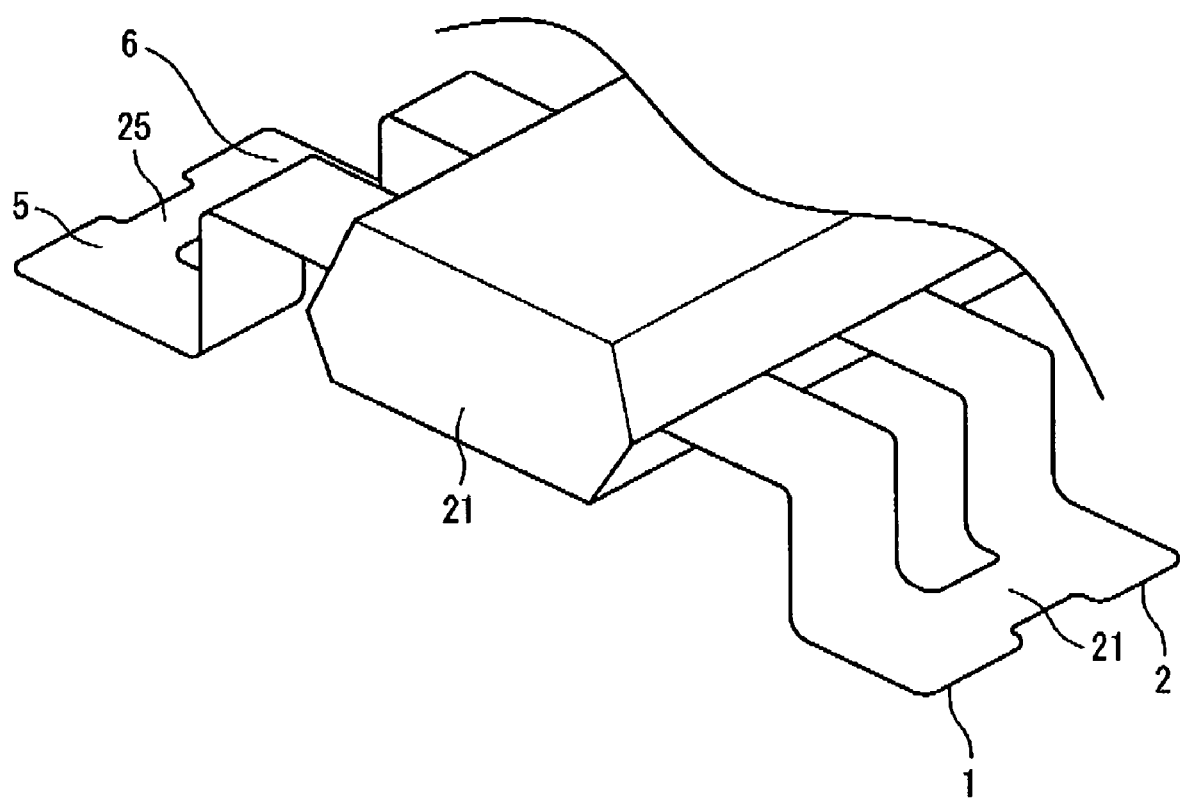
FIG. 13 is a bird's eye view for explaining the position of the connection bar at the time of completing the semiconductor device in the third embodiment of the present invention.

FIGS. 10 to 13 are bird's eye views for showing the positions of the connection bars 21 and 25 at the completion of the semiconductor device using the package according to the present embodiment. FIG. 10 shows a general type of a semiconductor device, and FIGS. 11 to 13 show a surface-mounting type of the semiconductor device. In the general type of the semiconductor device, it is desirable that the connection bars 21 and 25 are positioned adjacent to the main body of the semiconductor device package so that the legs of the semiconductor device are easily stuck into the board. In case of the surface-mounting type semiconductor device, the connection bars 21 and 25 can be provided at any portions of the legs of the semiconductor device such as the base, the center, or the tip of the legs.

Fourth Embodiment

Figure 14:
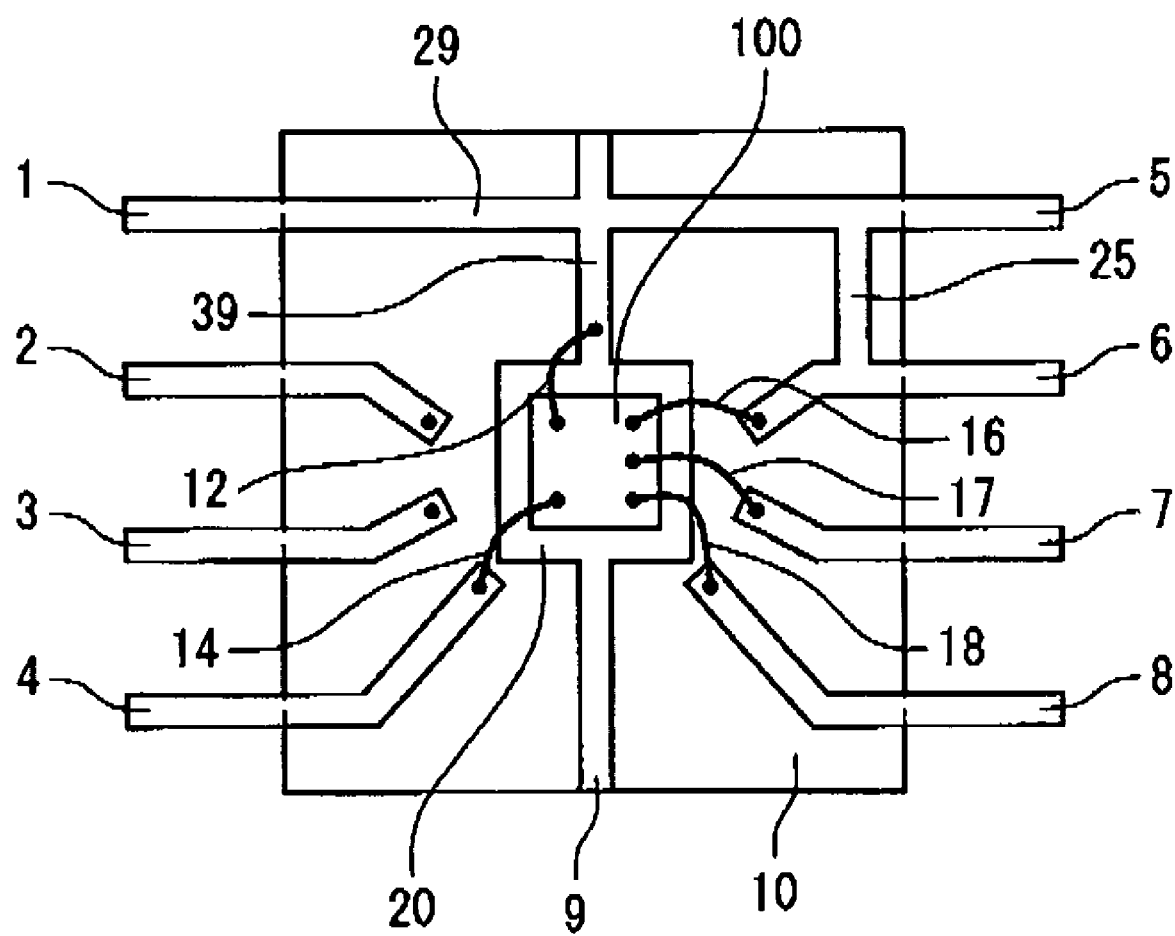
FIG. 14 is an overall view of a semiconductor device package according to a fourth embodiment of the present invention.

FIG. 14 is a diagram showing the whole of a semiconductor device package according to a fourth embodiment of the present invention. The semiconductor device package of the present embodiment is provided with the resin mold 10, the island 20, the plurality of pins 1 to 8, the connection bars 25 and 29, and the plurality of bonding wires 12, 14, and 16 to 18. A total number of pins and a total number of bonding wires are not limited to them.

The island 20 is used for mounting the semiconductor chip 100. The island 20 is supported by two suspending pins 9 and 39. The pin 39 as an upper one of two suspending pins integrally intersects with the connection bar 29, and is connected at this intersection point. The suspending pin 39 and the pin 6 are connected to two RF input/output sections of the semiconductor chip 100 via the bonding wires 12 and 16, respectively.

Since the pins 4, 7 and 8 and the bonding wires 14, 17 and 18 are same as the first embodiment, a detailed description thereof is omitted. The pins 2 and 3 are not electrically connected to the semiconductor chip 100. Although such pins may be omitted, one or more such pin may be included. The pins 1 and 5 are to be connected to the external antenna conductors 41 and 42 after the semiconductor device has completed.

Here, the sequential connection is established in the order of the external antenna conductor 41, the pin 1, the connection bar 29, the pin 5, and the external antenna conductor 42. They serve as an antenna all together. In this case, the function of a Γ-matching circuit is achieved to the above-mentioned antenna by the suspending pin 39, the bonding wire 12, the bonding wire 16, the portion of the pin 6 from the bonding wire 16 to the connection bar 25, and the connection bar 25. The Γ-matching circuit is used for the same purpose as the T-matching circuit while they have the shapes different from each other. In the Γ-matching circuit, the center portion of the antenna is grounded, whereas in the present embodiment, the center of the antenna is located at a midpoint between the pin 1 and the pin 5. In other words, the midpoint is the intersection point of the connection bar 29 and the suspending pin 39. The island 20 connected to the suspending pin 39 is often grounded in the semiconductor chip 100, and thus no problem concerning the ground arises.

Fifth Embodiment

Figure 15:
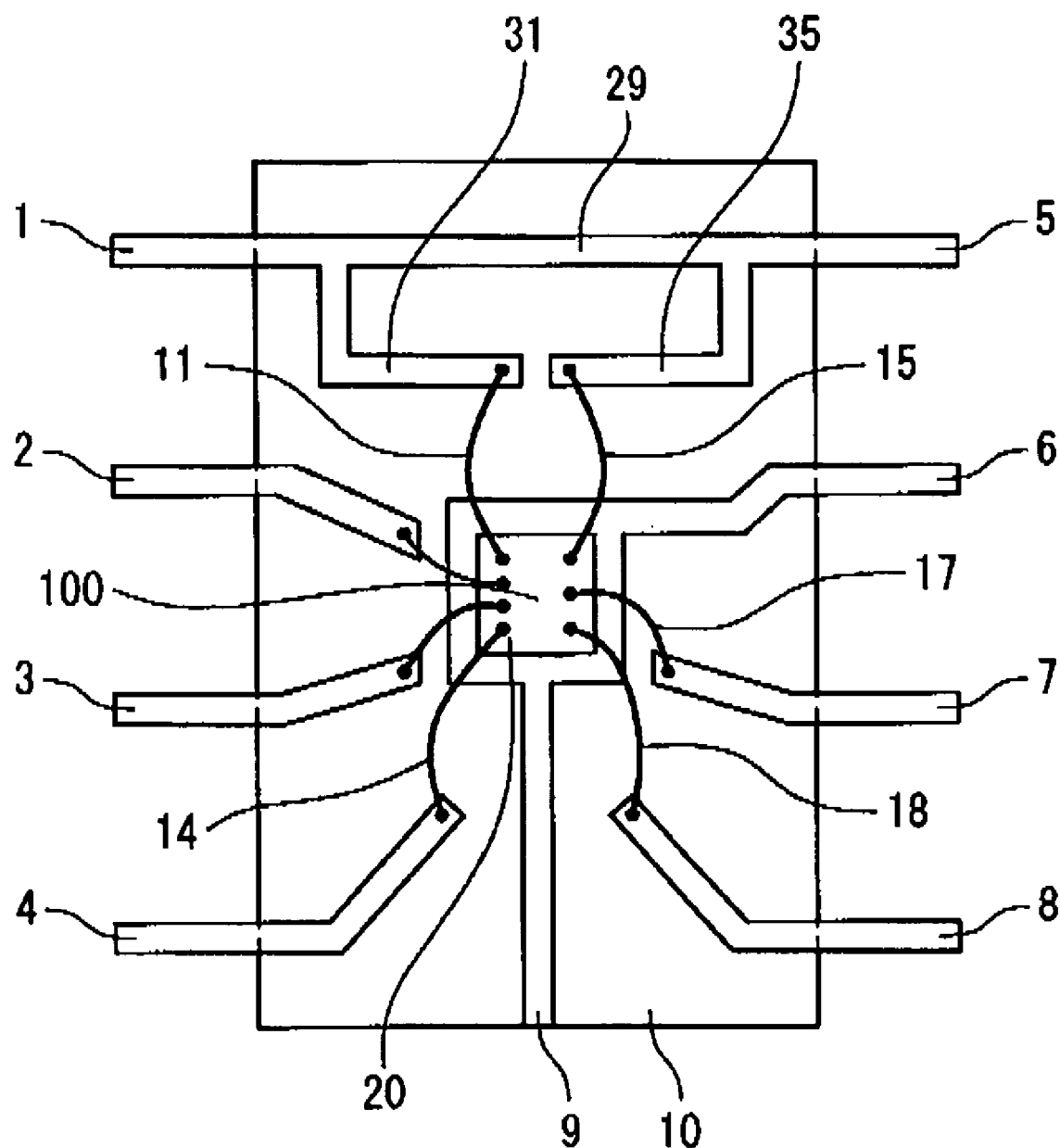
FIG. 15 is an overall view of a semiconductor device package according to a fifth embodiment of the present invention.

FIG. 15 is a diagram showing the whole of a semiconductor device package according to a fifth embodiment of the present invention. The semiconductor device package of the present embodiment is provided with the resin mold 10, the island 20, the plurality of pins 1 to 8, and the plurality of bonding wires 11, 14, 15, 17 and 18. A total number of pins and a total number of bonding wires are not limited to them, and they may be freely designed.

The island 20 is used for mounting the semiconductor chip 100. The island 20 is supported by two suspending pins 9. The pin 1 and the pin 5 are to be connected to the external antenna conductors 41 and 42. The pin 1 and the pin 5 are integrally connected by the connection bar 29. The sequential connection is established in the order of the external antenna conductor 41, the pin 1, the connection bar 29, the pin 5, and the external antenna conductor 42. They serve as an antenna all together.

As described above, the pin 1, the connection bar 29, and the pin 5 are integrated, and two connection bars 31 and 35 are also connected thereto. One end of the connection bar 31 is connected to the pin 1, and the other end thereof is connected to one of two RF input/output sections. Likewise, one end of the connection bar 35 is connected to the pin 5, and the other end thereof is connected to one of two RF input/output sections. In the antenna provided with the external antenna conductor 41, the pin 1, the connection bar 29, the pin 5 and the external antenna conductor 42, the gathering of the connection bars 31 and 35 serves as the T-matching circuit.

In FIG. 15, the connection bars 31 and 35 take the form of L-shape, respectively. This is an example of the shapes preferable as the T-matching circuit, and the other shapes may be employed.

The present embodiment does not include any redundant pins. That is, there is no pin that is meaningless electrically even though the number of pins of the semiconductor device package is same as that of the pads of the semiconductor chip. This is because no pin is appropriated as the T-matching circuit. The pin 6 supporting the island 20 is utilized as a ground.

Sixth Embodiment

Figure 16:
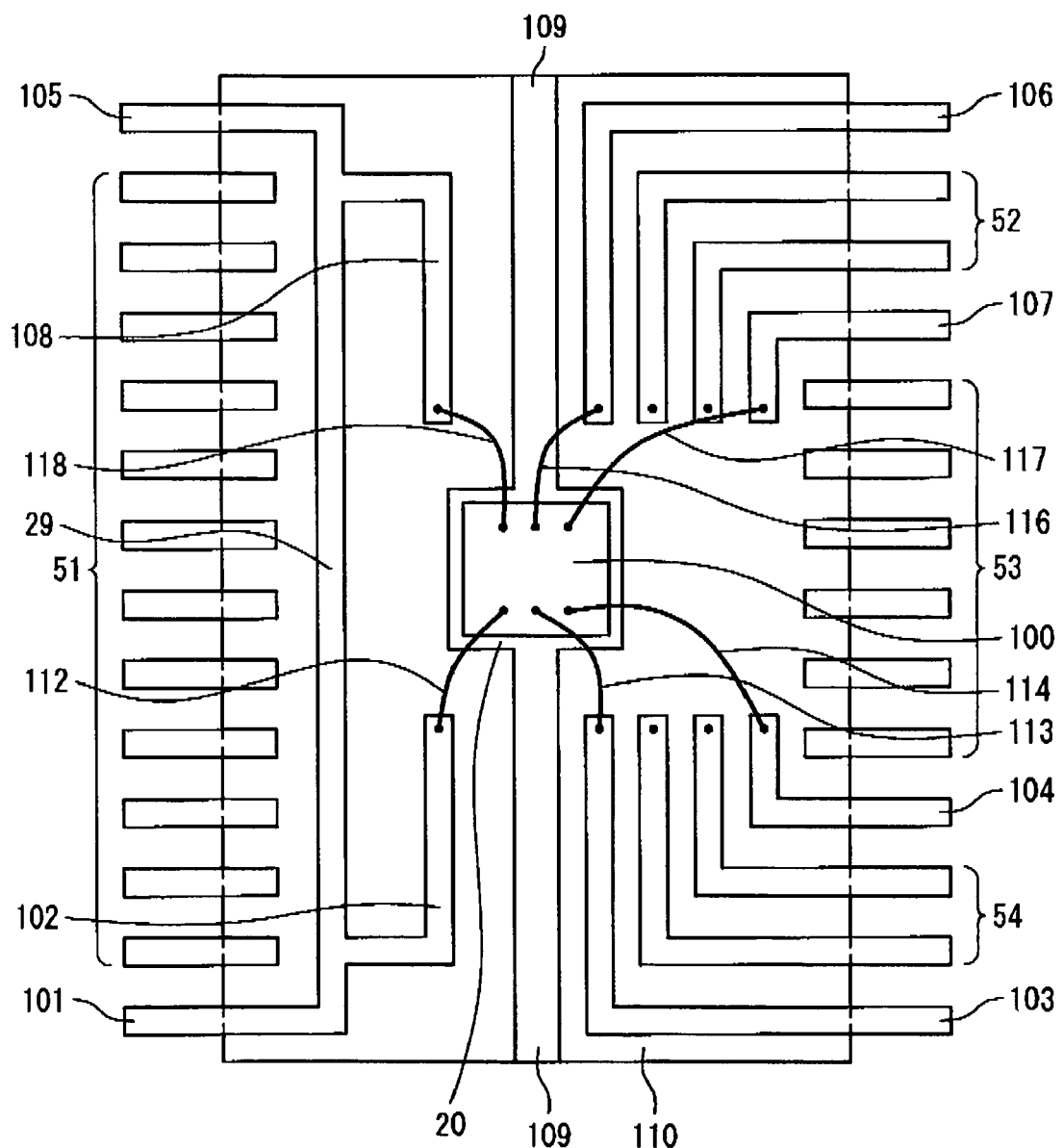
FIG. 16 is an overall view of a semiconductor device package according to a sixth embodiment of the present invention.

FIG. 16 is a diagram showing a semiconductor device package according to a sixth embodiment of the present invention. The present embodiment differs from the above embodiments in that the antenna is provided in a longitudinal direction of the semiconductor device package. The dimension of the semiconductor device package can be easily changed in a longitudinal direction, rather than in a width direction. Therefore, the present embodiment can provide an easier way to form a longer antenna, e.g., to correspond to a lower frequency.

The semiconductor device package of the present embodiment is provided with the resin mold 110, the island 20, a plurality of pins 101, 103 to 107, a further plurality of pins 51 to 54, a plurality of bonding wires 112 to 118. A total number of pins and a total number of bonding wires are not limited to them, and they can be freely designed.

The island 20 is used for mounting the semiconductor chip 100. The island 20 is supported by two suspending pins 109. The pin 101 and the pin 105 are to be connected to the external antenna conductors 41 and 42, respectively. The pin 101 and the pin 105 are connected by the connection bar 29 and also integrated with each other. The sequential connection is established in the order of the external antenna conductor 41, the pin 101, the connection bar 29, the pin 105, and the external antenna conductor 42. They serve as an antenna all together.

The pin 101, the connection bar 29, and the pin 105 provide two connection bars 102 and 108 branched therefrom and connected thereto. Two connection bars 102 and 108 are provided to serve as the T-matching circuit for the above-mentioned antenna, and have the shapes preferable as the T-matching circuit. Here, two connection bars 102 and 108 are in the form of L-shape, but may be the other shapes. One of both ends of the connection bar 102 is integrally connected to the pin 101. The other one of both ends of the connection bar 102 is connected to one of two RF input/output sections of the semiconductor chip 100. Likewise, one of both ends of the connection bar 108 is integrally connected to the pin 105. The other end of the connection bar 108 is connected to the other of two RF input/output sections of the semiconductor chip 100.

The pins 103, 104, 106 and 107 are used by the semiconductor chip 100 to input and output various signals and supply the power. It should be noted that the pins 103, 104, 106 and 107 may be fixed on a VDD or the ground, or remain floating depending on the semiconductor chip 100.

While the plurality of pins 51 to 54 are not electrically connected to the semiconductor chip 100, this can be changed anywise depending on the semiconductor chip 100. In particular, the plurality of pins 51 can be connected to any input/output sections of the semiconductor chip 100 by bypassing the connection bar 29 by means of the bonding wire. The semiconductor device package according to the present invention presumes a DIP (Dual Inline Package). However, the sixth embodiment is applicable to the other packages, particularly to a QFP (Quad Flat Package) having legs in four directions.

As explained above, the semiconductor device package according to the present invention has various features. That is, in the first, fourth and fifth embodiments, the island 20 is supported by two suspending pins opposite to each other. In contrast, in the second, third and sixth embodiments, at least one of two suspending pins supporting the island 20 is oriented leftward and rightward.

Further, in the first to fourth embodiments, the matching circuit is connected to the pins. In contrast, in the fifth and sixth embodiments, the matching circuit is not connected to the pins.

Furthermore, in the first, second, and fourth to sixth embodiments, the connection bars are placed within the resin mold. In contrast, in the third embodiment, the connection bars are placed outside of the resin mold.

Moreover, in the first to third, fifth and sixth embodiments, the semiconductor device package is provided with the T-matching circuit. Furthermore, in the fourth embodiment, the semiconductor device package is provided with the Γ-matching circuit.

In order to achieve the semiconductor device using the above package of the present invention, such a plurality of features can be freely combined in a range without causing physical or technical contradiction.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A semiconductor device comprising:
   a semiconductor chip configured to process a signal in a radio frequency band;
   two conductive antenna connection pins connected with two external antenna conductors, respectively;
   an island for said semiconductor chip to be mounted thereon;
   a suspending pin connected with said island; and
   an antenna connection conductor configured to connect said two antenna connection pins without connection with said island and said suspending pin,
   wherein a series connection of one of said two external antenna conductors, one of said two antenna connection pins, said antenna connection conductor, the other of said two antenna connection pins and the other of said two external antenna conductors in this order, functions as an antenna by connecting said series connection with said semiconductor chip.

2. The semiconductor device according to claim 1, further comprising:
   a first conductor connected with a first input/output section of said semiconductor chip for a signal in the radio frequency band; and
   a first conductive connection section configured to connect said one antenna connection pin with said first conductor,
   wherein said first connection section and said first conductor functions as a part of a matching circuit to said antenna.

3. The semiconductor device according to claim 2, further comprising;
   a second conductor connected with a second input/output section of said semiconductor chip for a signal in the radio frequency band; and
   a second conductive connection section configured to connect said other antenna connection pin with said second conductor, wherein said second connection section and said second conductor functions as a part of said matching circuit to said antenna.

4. The semiconductor device according to claim 3, further comprising:
a resin mold adapted to seal said semiconductor chip,
wherein said first connection section and said second connection section are arranged inside said resin mold.

5. The semiconductor device according to claim 4, wherein said suspending pin is arranged between said two antenna connection pins,
wherein said antenna connection conductor comprises a bonding wire provided to avoid said suspending pin.

6. The semiconductor device according to claim 3, further comprising:
a resin mold adapted to seal said semiconductor chip,
wherein said first connection section and said second connection section are arranged outside said resin mold.

7. The semiconductor device according to claim 6, wherein said suspending pin is arranged between said two antenna connection pins,
wherein said antenna connection conductor comprises a bonding wire provided to avoid said suspending pin.

8. The semiconductor device according to claim 2, further comprising:
a second conductor connected with a second input/output section of said semiconductor chip for a signal in the radio frequency band, and said connection conductor,
wherein said second conductor functions as a part of said matching circuit to said antenna, and
said matching circuit carries out gamma matching.

9. The semiconductor device according to claim 1, further comprising:
two conductive connection bars connected with said two antenna connection pins, respectively,
wherein said two connection bars are connected with two input/output sections of said semiconductor chip for the signals in said radio frequency band, and function as a T matching circuit to said antenna.

10. The semiconductor device according to claim 9, further comprising:
a connection conductor connecting said two conductive antenna connection pins is arranged in a longitudinal direction of said semiconductor package.

11. The semiconductor device according to claim 1, further comprising:
a connection conductor connecting said two conductive antenna connection pins is arranged in a lateral direction of said semiconductor chip.

* * * * *